United States Patent [19]

Cotter, Robert J. et al.

[11] Patent Number: 4,816,505

[45] Date of Patent: Mar. 28, 1989

[54] NEW POLYARYLETHERSULFONE CIRCUIT BOARD SUBSTRATES

[75] Inventors: Cotter, Robert J., Barnardsville; Stephen B. Rimsa, Lebanon; Robert Barclay, Jr., Trenton, all of N.J.

[73] Assignee: Amoco Corporation, Chicago, Ill.

[21] Appl. No.: 135,741

[22] Filed: Dec. 21, 1987

[51] Int. Cl.$^4$ .................... B32B 15/02; B32B 15/08; C08G 65/40

[52] U.S. Cl. ................... 524/445; 428/209; 428/901; 524/449; 524/609; 524/611; 528/171; 528/174

[58] Field of Search .......... 524/609; 428/901; 528/125, 126, 174, 175, 171; 428/209

[56] References Cited

U.S. PATENT DOCUMENTS

| | | | |
|---|---|---|---|
| 4,108,837 | 8/1978 | Johnson et al. | 524/609 |
| 4,281,038 | 7/1981 | Ambros et al. | 524/609 |
| 4,550,140 | 10/1985 | Rimsa et al. | 525/436 |

*Primary Examiner*—Allan M. Lieberman
*Attorney, Agent, or Firm*—Frederick S. Jerome; William H. Magidson; Ralph C. Medhurst

[57] ABSTRACT

Described herein are circuit board substrates prepared from certain poly(aryl ethers) based on 4,4'-dichlorodiphenyl sulfone.

11 Claims, No Drawings

NEW POLYARYLETHERSULFONE CIRCUIT BOARD SUBSTRATES

FIELD OF THE INVENTION

This invention relates to circuit boards prepared from certain poly(aryl ethers) based on 4,4'-dichlorodiphenyl sulfone.

BACKGROUND OF THE INVENTION

Circuit boards are widely used in the electrical industry for radio, television, computers, appliances, industrial and electronic equipment. Printed circuit boards have been traditionally manufactured from a copper clad epoxy-glass laminate. When starting with this material, the shape of the printed circuit board must first be routed out and the holes for mounting the components (e.g., transistors, resistors, integrated circuits, etc.) individually drilled. The board is then masked with photoresist, the circuitry imaged, and the copper etched away from areas where it is not wanted.

Another procedure for manufacturing printed circuit boards involves injection molding the circuit board substrate with the holes in place. The molded substrate is then put through several adhesion promotion steps and plated with electroless copper according to standard technology, to produce the printed circuit board. In this injection molding procedure, the substrate material is limited to thermoplastic resins which resist blistering or distortion under the conditions needed for soldering. In wave soldering, currently the dominant method, one side of the plastic board briefly contacts an agitated pool of molten solder, and heating of the board is localized. In the emerging surface mount technologies, including vapor phase soldering (VPS), on the other hand, the entire plastic board is exposed to temperatures of at least 215° C. (419° F.). Obviously, savings result with these injection molded circuit board substrates due to the elimination of considerable mechanical processing such as routing and drilling.

The critical parameters of a printed circuit board, from a soldering standpoint, are its glass transition temperature (Tg), environmental stress crack resistance and thermal expansion coefficient. The higher a substrate's glass transition temperature (Tg) and environmental stress crack resistance to solder fluxes, the less likely it will blister or delaminate during soldering.

Other parameters of a printed circuit board are its plateability and resistance to water absorption. Acceptable plateability requires good adhesion of electrolessly plated copper to the circuit board substrate. Acceptable resistance to water absorption requires little or no water assimilation into the circuit board substrate so as to provide good electrical properties.

Poly(aryl ether)s containing the following repeat units:

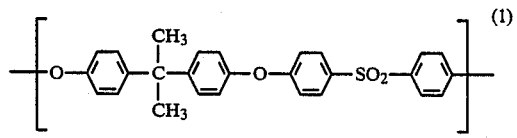

or

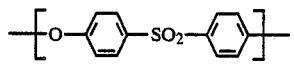

are commercially available thermoplastic polymers which have a wide variety of end-use applications. These thermoplastic polymers are described in, for example, U. S. Pat. Nos. 4,175,175 (formula 1) and 4,008,203 (formula 2). Such end-use applications include the use of these thermoplastic polymers for injection molding into circuit board substrates. However, a circuit board substrate molded from the poly(aryl ether) of formula (1) has a glass transition temperature (Tg) which is generally not as high as desired for soldering temperatures such as those encountered in wave soldering. Circuit boards molded from the poly(aryl ether) of formula (2) have an acceptable glass transition temperature (Tg) but do not have, in some instances, acceptable plateability and resistance to water absorption.

U.S. Pat. No. 4,520,067 describes a blend composition useful for making circuit board substrates and electrical connectors containing from 40 to 90 weight percent of a poly(ether sulfone), i.e., such as that of formula (2) above, and from 10 to 60 weight percent of a polysulfone, i.e., such as that of formula (1) above. A circuit board substrate molded from the blend composition is stated to have improved plateability.

U.S. patent application Ser. No. 448,376, filed Dec. 9, 1982, describes a blend composition useful for making circuit board substrates and electrical connectors, containing a poly(aryl ether), i.e., such as that of formulas (1) or (2) above, a poly(etherimide), fiber and a filler. A circuit board substrate molded from the blended composition is stated to have improved plateability.

U.S. patent application Ser. No. 011,898, filed Feb. 6, 1987, commonly assigned, describes select poly(aryl ether sulfone) polymers useful for molding into a circuit board substrate. Incorporation of specified amounts of hydroquinone in the synthesis of a polymer such as that of formula (2) above, produces a poly(aryl ether sulfone) which is suitable for being molded into circuit board substrates. When metal is electroplated onto such circuit board substrates, it is stated that there is a high degree of adhesion of the metal to the circuit board substrate.

U.S. Pat. No. 4,550,140 describes circuit board substrates prepared from poly(aryl ethers) which contain repeating units derived from bis(3,5-dimethyl-4-hydroxyphenyl)sulfone. These substrates are claimed to exhibit adequate glass transition temperatures (Tg), acceptable plateability and acceptable resistance to water absorption.

DISCLOSURE OF THE INVENTION

It has been found as a result of this invention, that acceptable circuit board substrates can be prepared from a composition comprising a poly(aryl ether) containing recurring units of the following formula:

$$-O-E-O-E'-$$

wherein E' is the residiuum of 4,4'-dichlorodiphenyl sulfone, and E is selected from the roup of tetramethylbisphenol-A(TMBA), optionally admixed with up to 50 mole percent of a second diphenol, such as 4,4'-biphenol or bisphenol-A; and from specified mixtures of (a) 4,4'-dihydroxy diphenyl sulfone(4,4,-bisphenol-S)/2,2-bis(4-hydroxyphenyl)propane (bisphenol-A);
(b) 4,4'-biphenol/bisphenol-A;
(c) 4,4'-biphenol/hydroquinone;
(d) 4,4'-biphenol/4,4'-bisphenol S; and
(e) hydroquinone/bisphenol-A.

The poly(aryl ethers) have a reduced viscosity of at least about 0.3 dl/g as measured in N-methylpyrrolidone, at 25° C., at a concentration of 1.0 g/100 ml. Circuit board substrates molded from these poly(aryl ethers) have desirable properties, including an adequate glass transition temperature (Tg) and acceptable plateability and resistance to water.

DETAILED DESCRIPTION OF THE INVENTION

The poly(aryl ether)s may be described as linear, thermoplastic poly(aryl ether)s. They are generally prepared by reacting a dihydric phenol with an activated dihalo-substituted aromatic compound. The essential feature of the poly(aryl ether) is the requirement that the polymer chain contains repeating units derived from 4,4'-dichlorodiphenyl sulfone (3).

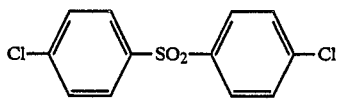
(3)

Specifically, the poly(aryl ether)s utilized in manufacturing the circuit board substrates of this invention contain recurring units of the following formula:

wherein E' is the residue of (3), e.g. (4)

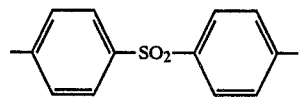
(4)

and E is the residue of a dihydric phenol. The dihydric phenol is selected from the group consisting of:
(a) tetramethylbisphenol-A, optionally containing up to 50 mole percent of 4,4'-biphenol and/or bisphenol-A; or
(b) mixtures of 4,4'-bisphenol-S and bisphenol-A containing from about 60 to about 70 mole percent of bisphenol-A; or
(c) mixtures of 4,4'-biphenol and bisphenol-A containing from about 50 to about 90 mole percent of 4,4'-biphenol; or
(d) mixtures of 4,4'-biphenol and hydroquinone containing from about 10 to about 90 mole percent of 4,4'-biphenol; or
(e) mixtures of 4,4'-biphenol and 4,4'-bisphenol-S containing from about 60 to about 90 mole percent of 4,4'-biphenol; or
(f) mixtures of hydroquinone and bisphenol-A containing from about 60 to about 90 mole percent of hydroquinone.

It must be pointed out that the proportions of the diphenols given above are critical; small changes often lead to unsatisfactory results as illustrated in more detail below.

We note that the tetramethylbisphenol-A copolymers containing bisphenol-A and/or 4,4'-biphenol are new compositions of matter. In addition to being useful in circuit board applications, these poly(aryl ether)s display excellent mechanical properties and high glass transition temperatures (>215° C.). In fact, as indicated by the data of Table 6, these copolymers display better ductility and better toughness than the homopolyether from tetramethylbisphenol-A and 4,4'-dichlorodiphenyl sulfone. These resins containing from about 5 to 95, preferably from about 20 to about 80 mole percent of 4,4'-biphenol and/or bisphenol-A (based on total diphenols) are, therefore, useful engineering thermoplastics in their own right.

The polymers of this invention may be prepared by either of two methods, i.e., the carbonate method or the alkali metal hydroxide method.

In the carbonate method, the polymers are prepared by contacting substantially equimolar amounts of the hydroxy-containing compounds and dihalodiarylsulfones, e.g., 4,4'-dichlorodiphenyl sulfone or 4,4'-difluorodiphenyl sulfone, with from about 0.5 to about 1.0 mole of an alkali metal carbonate per mole of hydroxyl group in a solvent mixture comprising a solvent which forms an azeotrope with water in order to maintain the reaction medium at substantially anhydrous conditions during the polymerization.

The temperature of the reaction mixture is kept at about 190° C. to about 250° C., preferably from about 210° C. to about 240° C. for about one to 15 hours.

In a modification which is particularly suitable for making copolymers from bisphenol A and one or more additional dihydroxy compounds, the reactants other than said additional dihydroxy compounds are charged and heated at from about 120° C. to about 180° C. for about one to about 5 hours, said additional dihydroxy compounds are added, the temperature is raised and the mixture is heated at from about 200° C. to about 250° C., preferably from about 210° C. to about 240° C., for about one to 10 hours. This modification is further described in the copending U.S. patent application of Donald R. Kelsey, et al., Ser. No. 068,973, filed July 1, 1987, now U.S. Pat. No. 4,783,520, commonly assigned.

The reaction is carried out in an inert atmosphere, e.g., nitrogen, at atmospheric pressure, although higher or lower pressures may also be used.

The polyarylethersulfone is then recovered by conventional techniques such as coagulation, solvent evaporation, and the like.

The solvent mixture comprises a solvent which forms an azeotrope with water and a polar aprotic solvent. The solvent which forms an azeotrope with water includes an aromatic hydrocarbon such as benzene, toluene, xylene, ethylbenzene, chlorobenzene, and the like.

The polar aprotic solvents employed in this invention are those generally known in the art for the manufacture of polyarylether sulfones and include sulfur containing solvents such as those of the formula:

in which each $R_1$ represents a monovalent lower hydrocarbon group free of aliphatic unsaturation, which preferably contains less than about 8 carbon atoms or when connected together represents a divalent alkylene group with b being an integer from 1 to 2 inclusive. Thus, in all of these solvents, all oxygens and two carbon atoms are bonded to the sulfur atom. Contemplated for use in this invention are such solvents as those having the formula:

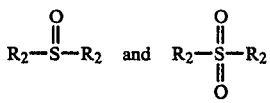

where the $R_2$ groups are independently lower alkyl, such as methyl, ethyl, propyl, butyl, and like groups, and aryl groups such as phenyl and alkylphenyl groups such as the tolyl group, as well as those where the $R_2$ groups are interconnected as in a divalent alkylene bridge such as:

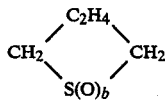

in tetrahydrothiophene oxides and dioxides. Specifically, these solvents include dimethylsulfoxide, dimethylsulfone, diphenylsulfone, diethylsulfoxide, diethylsulfone, diisopropylsulfone, tetrahydrothiophene 1,1-dioxide (commonly called tetramethylene sulfone or sulfolane) and tetrahydrothiophene-1 monoxide.

Additionally, nitrogen containing solvents may be used. These include dimethylacetamide, dimethylformamide and N-methylpyrrolidone.

The azeotrope forming solvent and polar aprotic solvent are used in a weight ratio of from about 1:10 to about 1:1, preferably from about 1:5 to about 1:3.

In the reaction, the hydroxy containing compound is slowly converted, in situ, to the alkali salt thereof by reacting with the alkali metal carbonate. The alkali metal carbonate is preferably potassium carbonate. Mixtures of carbonates such as potassium and sodium carbonate may also be used.

Water is continuously removed from the reaction mass as an azeotrope with the azeotrope forming solvent so that substantially anhydrous conditions are maintained during the polymerization.

It is essential that the reaction medium be maintained substantially anhydrous during the polycondensation. While amounts of water up to about one percent can be tolerated, and are somewhat beneficial when employed with fluorinated dihalobenzenoid compounds, amounts of water substantially greater than this are desirably avoided as the reaction of water with the halo and/or nitro compound leads to formation of phenolic species and only low molecular weight products are secured. Consequently, in order to secure the high polymers, the system should be substantially anhydrous, and preferably contain less that 0.5 percent by weight water during the reaction.

Preferably, after the desired molecular weight has been attained, the polymer is treated with an activated aromatic halide or an aliphatic halide such as methyl chloride or benzyl chloride, and the like. Such treatment of the polymer converts the terminal hydroxyl groups into ether groups which stabilize the polymer. The polymer so treated has good melt and oxidative stability.

While the carbonate method for preparing the polymer of this invention is simple and convenient, in some cases products of higher molecular weight can be made by the alkali metal hydroxide method. In the alkali metal hydroxide method, described by Johnson et al., U.S. Pat. Nos. 4,108,837 and 4,175,175, a double alkali metal salt of a dihydric phenol is contacted with a dihalobenzenoid compound in the presence of a sulfur containing solvent as herein above defined under substantially anhydrous conditions.

Additionally, the polymers of this invention may be prepared by other methods known in the prior art, in which at least one dihydric phenol and at least one dihalobenzenoid compound are heated, for example, with a mixture of sodium carbonate or bicarbonate and a second alkali metal carbonate or bicarbonate having a higher atomic number than that of sodium, as described in U.S. Pat. No. 4,176,222.

The molecular weight of the poly(aryl ether)s utilized in manufacturing the circuit board substrates of this invention is indicated by reduced viscosity data in N-methylpyrrolidone. As well understood in the art, the viscosity of a resin solution bears a direct relationship to the weight average molecular size of the polymer chains, and is typically the most important single property that can be used to characterize the degree of polymerization. The reduced viscosity assigned to the poly(aryl ether)s is therefore to be understood as significant in reflecting molecular weight rather than a consideration concerning the viscosity per se. Most of these poly(aryl ether) polymers are readily soluble in N-methylpyrrolidone, chloroform, or tetrachloroethane or other similar solvents.

Reduced viscosity (R.V.) as used in the examples herein was determined by dissolving a 1.0 gram sample of the poly(aryl ether) polymer in N-methylpyrrolidone contained in a 100 milliliter volumetric flask so that the resultant solution measured exactly 100 milliliters at 25° C. in a constant temperature bath. The viscosity of 3 milliliters of the solution which had been filtered through a sintered glass funnel was determined in an Ostwald or similar type viscometer at 25° C. Reduced viscosity values were obtained from the equation:

$$\text{Reduced Viscosity} = \frac{t_s - t_o}{C \times t_o}$$

wherein:
$t_o$ is the efflux time of the pure solvent;
$t_s$ is the efflux time of the polymer solution; and
C is the concentration of the polymer solution expressed in terms of grams of polymer per 100 milliliters of solution.

The poly(aryl ether)s utilized in manufacturing the circuit board substrates of this invention are characterized as linear thermoplastic structures which have a relatively high molecular weight, that is, a reduced viscosity determined at a concentration of 1.0 g/100 ml in N-methylpyrrolidone at 25° C. of at least 0.3 dl/g, preferably at least 0.5 dl/g and, typically, not exceeding about 1.5 dl/g. These polymers provide highly desirable properties to circuit boards prepared therefrom. Circuit board substrates molded from these poly(aryl ether)s have an adequate glass transition temperature (Tg), acceptable plateability and acceptable resistance to water absorption.

In order to determine the usefulness of the polymers for circuit board applications the polymers were tested by simulated vapor phase soldering (VPS) of samples which had been saturated with water. Molded specimens were immersed in water under ambient temperature and were weighed periodically until they appeared to have absorbed an equilibrium amount of water. The wet samples were then immersed in a fluorocarbon vapor at 215° C. for a predetermined length of time, removed, and examined. The samples were divided into three classes:

Class 1: little or no deformation;
Class 2: minor surface deformation, may have fine interior bubbles;
Class 3: severe deformation, often including large bubbles.

Experience has shown that polymers of Class 1 and Class 2, but not Class 3, can be formulated to give molded circuit boards which can be soldered without preliminary drying.

The results of the VPS test cannot be predicted from the structure and other properties of the polymers. The glass transition temperature of the polymer, the amount of water absorbed, the mechanism and rate of water evolution, the extent to which the glass transition temperature is altered by the presence of water, and probably other unknown factors, all influence the behavior of the circuit board substrate under VPS conditions. The test itself is an excellent simulation of actual processing conditions and shows that VPS behavior may be affected in unpredictable ways by relatively small changes in composition. Thus, as shown in Example 1 and Comparative Examples A and B, a copolymer made from 65 mole percent bisphenol S and 35 mole percent bisphenol A gave Class 2 performance, whereas the analogous copolymers containing 85 or 50 mole percent bisphenol S were rated Class 3.

The poly(aryl ether)s utilized in manufacturing the circuit board substrates of this invention may be optionally used with other ingredients such as stabilizers, i.e., metal oxides such as zinc oxide, antioxidants, flame retardants, pigments, and the like. The poly(aryl ether)s may be optionally used with reinforcing fibers and/or inorganic fillers. The reinforcing fiber includes fiberglass, carbon fibers, and the like, and mixtures thereof. The carbon fibers include those having a high Young's modulus of elasticity and high tensile strength. These carbon fibers may be produced from pitch, as described in U.S. Pat. Nos. 3,976,729; 4,005,183 and 4,026,788, for example. The particulate inorganic fillers which may be used include wollastonite, calcium carbonate, glass beads, talc, mica, clay, quartz and the like, or mixtures thereof.

The fiber reinforcement, filler or combinations thereof, can be utilized in amounts of from 0 to about 50 weight percent, preferably from about 10 to about 35 weight percent, of the total weight of the circuit board substrate.

The poly(aryl ether)s in combination with other ingredients can be prepared by any conventional mixing methods. For example, the poly(aryl ether)s and other optional ingredients in powder or granular form can be blended in an extruder and the mixture can be extruded into strands and the strands can be chopped into pellets. The pellets can then be molded into the desired circuit board substrate by conventional techniques.

The poly(aryl ether)s can be molded into circuit board substrates using conventional techniques such as injection molding or via extrusion of sheets.

Specifically, the composition can be processed into circuit board substrates using conventional molding equipment or die punching of the extruded sheets. The molded boards may then be swelled and etched to promote the adhesion of copper by both roughening the surface and introducing chemical moieties through oxidation if electroless deposition is to be utilized. The circuitry is then applied to the board via either conventional electroless deposition, vacuum deposition, sputtering, or via the use of polymer thick film materials or combinations thereof.

As used in this invention, the glass transition temperature (Tg) of the polymers herein has a direct correlation with the heat distortion temperature of the polymers. In general, the heat distortion temperature of the polymers is typically 10° C. to 20° C. below the glass transition temperature (Tg) of the amorphous polymers.

Although the invention has been described with respect to a number of details, it is not intended that this invention should be limited thereby. The examples which follow are intended solely to illustrate the embodiments of this invention which to date have been determined and are not intended in any way to limit the scope and intent of this invention.

The glass transition temperature (Tg) of the polymers prepared in the examples was measured by the resilience minimum technique using modulus-temperature data and resilience-temperature data as described in O. Olabisi et al., "Polymer-Polymer Miscibility", Academic Press, New York, 1979, pages 122-126.

EXAMPLES

The following examples serve to give specific illustrations of the practice of this invention but they are not intended in any way to limit the scope of this invention.

EXAMPLE 1

65/35 Molar 4,4'-Dihydroxydiphenyl Sulfone/(4,4'-Bisphenol A) Dichlorodiphenylsulfone Copolymer In a 500 ml, four-necked flask equipped with a stainless steel mechanical stirrer, a thermocouple, an addition funnel, and a Claisen arm fitted with a nitrogen inlet tube, a distillation trap, a condenser and an exit gas bubbler, were placed the following materials:

13.53 g ( 59.3 mmole) bisphenol A,
48.82 g (170.0 mmole) 4,4'-dichlorodiphenylsulfone,
24.91 g (180.2 mmole) anhydrous potassium carbonate,
181. g sulfolane, and
75. g toluene.

The mixture was heated under a nitrogen atmosphere; distillation of toluene and water began at 130° C. When the temperature reached 160° C., dropwise addition of toluene was started, and the temperature was maintained at 160°-163° C. for two hours. Toluene addition was stopped, the heating source was removed, and 4,4'-bisphenol S (27.55 g, 110.1 mmole) was added and rinsed in with about 10 ml of toluene. Heating was resumed, and toluene addition was restarted at 220° C. The mixture was maintained at 227°-233° C. for 4.5 hours and then allowed to cool to room temperature overnight. On the following day, the mixture was reheated to 200° C., addition of a mixture of sulfolane (30 g) and chlorobenzene (110 g) was started, and methyl chloride was sparged into the solution to endcap the polymer. The solution was further diluted with chlorobenzene (100 g) and then filtered hot through a bed of filter aid on a medium porosity fritted-glass funnel. The polymer was recovered by coagulation in a Waring blender, washed thoroughly with water and methanol, and dried in a vacuum oven at about 150° C. Yield 55.4 g (71.4%), reduced viscosity (measured in N-methylpyrrolidone, 1 g/dl, at 25° C.) 0.70 dl/g. The composition of the diphenol mixture used to make this copolymer was 65 mole percent 4,4'-bisphenol S/35 mole percent bisphenol A. The results of water absorption/vapor phase soldering tests on 4,4'-bisphenol S/bisphenol A-dichlorodiphenylsulfone copolymers are given in Table 1. The polymer of Example 1 gave satisfactory performance in the vapor phase soldering test and was rated Class 2.

Comparative Example A

An 85/15 molar 4,4'-bisphenol S/bisphenol A-dichlorodiphenylsulfone copolymer was prepared by essentially the same method as that of Example 1. The reduced viscosity, measured in N-methylpyrrolidone (0.2 g/dl at 25° C.), was 0.54 dl/g. As shown in Table 1, this polymer gave unsatisfactory performance in the vapor phase soldering test and was rated as Class 3.

Comparative Example B

A 50/50 molar 4,4'-bisphenol S/bisphenol A-dichlorodiphenyl sulfone copolymer was made by a process similar to that of Example 1 except that all of the reactants were charged to the reactor at the beginning of the run. Its reduced viscosity (0.2 g/dl in N-methylpyrrolidone at 25° C.) was 0.52 dl/g. As shown in Table 1, this polymer gave unsatisfactory performance in the vapor phase soldering test and was rated as Class 3.

EXAMPLE 2

60/40 Molar 4,4'-Biphenol/Bisphenol A-Dichlorodiphenylsulfone Copolymer

In an apparatus similar to that used in Example 1, were charged:
16.44 g (72.0 mmole) 4,4'-bisphenol A,
51.92 g (180.8 mmole) 4,4'-dichlorodiphenylsulfone,
29.98 g (216.9 mmole) anhydrous potassium carbonate,
160. g sulfolane, and
160. g chlorobenzene This mixture was stirred and heated under a nitrogen atmosphere. Distillation of water and chlorobenzene began when the temperature reached 149° C. When the temperature reached 170° C., dropwise addition of chlorobenzene was begun, and the temperature was maintained at 170°-172° C. for one hour. The heating source was removed and chlorobenzene addition stopped. 4,4'-Biphenol (20.12 g, 108.1 mmole) was added and rinsed in with chlorobenzene (about 10 ml), and the temperature was raised to 220° C. Chlorobenzene addition was resumed, and the temperature was maintained at 218°-220° C. for five hours. The polymer was endcapped and recovered essentially as in Example 1. Yield 50.6 g (67.2%), reduced viscosity (1 g/dl in N-methylpyrrolidone at 25° C.) 0.61 dl/g. The composition of the diphenol mixture used to make this copolymer was 60 mole percent 4,4'-biphenol/40 mole percent bisphenol A. Test results on the 4,4'-biphenol/bisphenol A-dichlorodiphenylsulfone copolymers are given in Table 2.

EXAMPLE 3

75/25 Molar 4,4'-Biphenol/Hydroquinone-Dichlorodiphenylsulfone Copolymer

In an apparatus similar to that used for Example 1, were placed the following materials:
27.82 g (149.4 mmole) 4,4'-biphenol,
5.48 g ( 49.8 mmole) hydroquinone,
57.43 g (200.0 mmole) 4,4'-dichlorodiphenylsulfone,
29.30 g (212.0 mmole) anhydrous potassium carbonate,
178. g sulfolane, and
76. g chlorobenzene.

The mixture was heated under nitrogen, a mixture of water and chlorobenzene starting to distill off at 160° C. The reaction mixture was stirred at 219°-221° C. with dropwise chlorobenzene addition for 3 hours. The polymer was endcapped and recovered essentially as in Example 1. Yield 43.6 g (57.3%), reduced viscosity (1 g/dl in N-methylpyrrolidone at 25° C.) 0.54 dl/g. The composition of the diphenol mixture used to make this copolymer was 75 mole percent 4,4'-biphenol/25 mole percent hydroquinone. The test results on the 4,4'-biphenol/hydroquinone dichlorodiphenylsulfone copolymers are given in Table 3.

EXAMPLE 4

75/25 Molar 4,4'-Biphenol/4,4'-Bisphenol S-Dichlorodiphenylsulfone Copolymer

In an apparatus similar to that used in Example 1 were placed:
22.83 g (122.6 mmole) biphenol,
10.23 g ( 40.9 mmole) 4,4'-bisphenol S,
46.94 g (163.5 mmole) 4,4'-dichlorodiphenylsulfone,
27.14 g (196.4 mmole) anhydrous potassium carbonate,
145. g sulfolane, and
145. g chlorobenzene.

The mixture was stirred and heated under a nitrogen atmosphere; water and chlorobenzene began to distil off at 148° C. At 213° C. addition of chlorobenzene was begun. The mixture was maintained for 1.5 hours at 212°-214° C. with chlorobenzene addition and then for an additional 4 hours at 214° C. without it. The polymer was endcapped and recovered essentially as in Example 1. Yield 43.6 g (64.0%), reduced viscosity (1 g/dl in N-methylpyrrolidone at 25° C.) 0.67 dl/g. The composition of the diphenol mixture used to make the copolymer was 75 mole percent 4,4'-biphenol/25 mole percent 4,4'-bisphenol S. The results on the 4,4'-biphenol/4,4'-bisphenol S-dichlorodiphenylsulfone copolymers are given in Table 4.

EXAMPLE 5

80/20 Molar Hydroquinone/Bisphenol A-Dichlorodiphenylsulfone Copolymer

In an apparatus similar to that used in Example 1 were placed the following materials:
19.30 g (175.3 mmole) hydroquinone,
10.01 g (43.8 mmole) bisphenol A,
63.18 g (220.0 mmole) 4,4'-dichlorodiphenylsulfone,
33.45 g (242.0 mmole) anhydrous potassium carbonate,
179. g sulfolane, and
77. g chlorobenzene.

The mixture was heated under a nitrogen atmosphere; distillation of chlorobenzene and water began at 160° C. At 220° C. dropwise addition of chlorobenzene was begun, and the temperature was held at 220° C. for 4.5 hours. The polymer was endcapped and recovered essentially as in Example 1. Yield 47.85 g (62.5%), reduced viscosity (1 g/dl in N-methylpyrrolidone at 25° C.) 0.52 dl/g. The composition of the diphenol mixture used to make this copolymer was 80 mole percent hydroquinone/20 mole percent bisphenol A. The results on the hydroquinone/bisphenol A-dichlorodiphenylsulfone copolymers are given in Table 5.

EXAMPLE 6
70/30 Molar Tetramethylbisphenol A/Biphenol-Dichlorodiphenylsulfone Copolymer The apparatus for this procedure consisted of a 500 ml, four-necked glass flask equipped with a stainless steel mechanical stirrer, a thermocouple probe, addition funnels of various sizes, an inlet tube for sparging gas below the liquid surface, and a Dean-Stark trap surmounted by a reflux condenser vented through a gas bubbler; heating was accomplished by an oil bath. In the flask were placed:

44.80 g (157.5 mmole) 4,4'-isopropylidenebis-(2,6-dimethylphenol) (tetramethylbisphenol A),
140. g toluene,
124. g dimethylsulfoxide, and
12.57 g (67.5 mmole) 4,4'-biphenol.

This mixture was stirred and heated under a nitrogen atmosphere. To it was added over 8 minutes at 40°–49° C. aqueous sodium hydroxide (49.47%, 36.31 g, 447.8 mmole); the contents of the addition funnel were rinsed in with a total of about 6 ml of hot deionized water. Temperature was raised over 29 minutes to 109° C. and then over 1.5 hours to 122° C. while water was periodically drained from the Dean-Stark trap. Toluene was then removed over 27 minutes, the temperature rising to 160° C. A hot solution of 4,4'-dichlorodiphenylsulfone (64.62 g, 225.0 mmole) in toluene (75 ml) was then added over 25 minutes at a reactor temperature of 160° C., and the addition funnel was rinsed with about 10 ml of hot toluene. The mixture was stirred for 4 hours at 160°–162° C., becoming very viscous. To it were added in quick succession aqueous sodium hydroxide (49.47%, 0.19 g, 2.3 mmole), hot deionized water (about 1 ml), and toluene (5 ml). The added water was readily removed by distillation. The mixture was stirred about one hour longer at 160° C., then allowed to cool overnight. On the second day, chlorobenzene (195 g) was added, and the temperature was raised to 130° C. to effect complete solution. Methyl chloride was sparged in for one hour at 111°–114° C. to endcap the polymer; then oxalic acid 1.0 g (11 mmole) was added, and the mixture was stirred for 30 minutes at 109°–111° C. The solution was filtered through a layer of filter aid on a coarse porosity fritted-glass funnel. The polymer was recovered by coagulation in a Waring blender, washed thoroughly with water and methanol, and dried in a vacuum oven at about 150° C. Yield 66.98 g (63.4%), reduced viscosity (1 g/dl in N-methylpyrrolidone at 25° C.) 0.53 dl/g. The composition of the diphenol mixture used to make this copolymer was 70 mole percent tetramethylbisphenol A/30 mole percent biphenol. Test results on the polymer containing tetramethylbisphenol A are given in Table 6.

EXAMPLE 7
60/40 Molar Tetramethylbisphenol A/Bisphenol A-Dichlorodiphenylsulfone Copolymer The procedure of Example 6 was followed with a diphenol mixture consisting of 38.39 g (135 mmole) tetramethylbisphenol A, and
20.55 g ( 90 mmole) bisphenol A.

Yield 67.66 g (63.1%), reduced viscosity (1 g/dl in N-methylpyrrolidone at 25° C.) 0.72 dl/g. The composition of the diphenol mixture used to make this copolymer was 60 mole percent tetramethylbisphenol A/40 mole percent bisphenol A. Test results are given in Table 6.

EXAMPLE 8
Tetramethylbisphenol A-Dichlorodiphenylsulfone Polymer

The procedure of Example 6 was followed with the diphenol consisting solely of tetramethylbisphenol A (63.99 g, 225.0 mmole). Yield 67.1 g (59.8%), reduced viscosity (1 g/dl in N-methylpyrrolidone at 25° C.) 0.71 dl/g. Physical properties of the tetramethylbisphenol A polymers and results of the water absorption/vapor phase soldering tests are given in Table 6. The data indicate that the copolymers have a yield point and therefore undergo ductile failure, whereas the tetramethylbisphenol A homopolymer exhibits brittle failure. The impact strengths of the copolymers are also much higher than that of the homopolymer.

TABLE 1

| Mole % | | | Equilib. Water | |
|---|---|---|---|---|
| Bisphenol S | Bisphenol A | Tg, °C. | Absorption, % | VPS Class |
| 100 | 0 | 220 | 2.31 | 3 |
| 85 | 15 | 220 | 1.92 | 3 |
| 70 | 30 | 215 | 1.68 | 2 |
| 65 | 35 | 215 | 1.56 | 2 |
| 57 | 43 | 205 | 1.44 | 2 (quite good) |
| 50 | 50 | 205 | 1.19 | 3 |
| 0 | 100 | 190 | 0.76 | 3 |

TABLE 2

| Mole % | | | Equilib. Water | |
|---|---|---|---|---|
| Biphenol | Bisphenol A | Tg, °C. | Absorption, % | VPS Class |
| 100 | 0 | 220 | 1.23 | 3 |
| 75 | 25 | 205 | 1.05 | 2 |
| 60 | 40 | 205 | 1.02 | 2 |
| 50 | 50 | 200 | 0.98 | 2 |
| 0 | 100 | 190 | 0.76 | 3 |

TABLE 3

| Mole % | | | Equilib. Water | |
|---|---|---|---|---|
| Biphenol | Hydroquinone | Tg, °C. | Absorption, % | VPS Class |
| 100 | 0 | 220 | 1.23 | 3 |
| 75 | 25 | 212 | 1.21 | 2 |
| 50 | 50 | 205 | 1.22 | 2 |
| 20 | 80 | 210 | 1.32 | 2 |

TABLE 4

| Mole % | | | Equilib. Water | |
|---|---|---|---|---|
| Biphenol | Bisphenol S | Tg, °C. | Absorption, % | VPS Class |
| 100 | 0 | 220 | 1.23 | 3 |
| 75 | 25 | 220 | 1.52 | 2 |

TABLE 4-continued

| Mole % | | | Equilib. Water | |
|---|---|---|---|---|
| Biphenol | Bisphenol S | Tg, °C. | Absorption, % | VPS Class |
| 0 | 100 | 220 | 2.31 | 3 |

TABLE 5

| mole % | | | Equilib. Water | VPS |
|---|---|---|---|---|
| Hydroquinone | Bisphenol A | Tg, °C. | Absorption, % | Class |
| 90 | 10 | 195 | 1.23 | 2 |
| 80 | 20 | 195 | 1.12 | 2 |
| 70 | 30 | 195 | 1.14 | 2 |
| 60 | 40 | 195 | 1.06 | 2 |
| 0 | 100 | 190 | 0.76 | 3 |

TABLE 6

| Example: | 6 | 7 | 8 |
|---|---|---|---|
| Comonomer: | Biphenol | Bisphenol A | None |
| Mole % | 30 | 40 | — |
| Tg, °C. | 230 | 220 | 235 |
| Yield Strength, psi | 11,700 | 11,200 | — |
| Tensile Strength, psi | 11,700 | 11,200 | 11,100 |
| Yield Elongation, % | 7.3 | 7.4 | — |
| Elongation at Break, % | 9.2 | 11.0 | 6.3 |
| Pendulum Impact, ft-lb/in$^3$ | 61 | 39 | 7 |
| Water absorption, % | 0.97 | 0.90 | 0.91 |
| VPS Class | 1 | 1* | 1 |

*No distortion, but a few bubbles.

What is claimed is:

1. A circuit board substrate molded from a composition comprising a poly(aryl ether) containing recurring units of the formula

—O—E—O—E'— wherein E is the residuum of

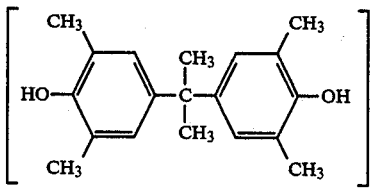

a mixture of dihydric phenols selected from the group consisting of tetramethylbisphenol-A and up to 50 mole percent of 4,4'-biphenol, tetramethylbisphenol-A and up to 50 mole percent of bisphenol-A, and tetramethylbisphenol-A and up to a total of 50 mole percent of 4,4'-biphenol and bisphenol-A; and wherein E' is the residuum of 4,4'-dichlorodiphenyl sulfone; and wherein the poly(aryl ether) has a reduced viscosity of at least 0.3 dl/g, as measured in N-methylpyrrolidone at a concentration of 1.0 g/100 ml at 25° C.

2. A circuit board substrate molded from a composition comprising a poly(aryl ether) containing recurring units of the formula

—O—E—O—E'— wherein E is the residuum of mixtures of 4,4'-dihydroxydiphenyl sulfone and bisphenol-A containing from about 60 to about 70 mole percent of bisphenol-A; and wherein E, is the residuum of 4,4'-dichlorodiphenyl sulfone; and wherein the poly(aryl ether) has a reduced viscosity of at least 0.3 dl/g, as measured in N-methylpyrrolidone, at a concentration of 1.0 g/100 ml. at 25° C.

3. A circuit board substrate molded from a composition comprising a poly(aryl ether) containing recurring units of the formula

—O—E—O—E'— wherein E is the residuum of mixtures of 4,4'-biphenol and bisphenol-A containing from about 50 to about 90 mole percent of 4,4'-biphenol; and wherein E' is the residuum of 4,4'-dichlorodiphenyl sulfone; and wherein the poly(aryl ether) has a reduced viscosity of at least 0.3 dl/g, as measured in N-methylpyrrolidone, at a concentration of 1.0 g/100 ml. at 25° C.

4. A circuit board substrate molded from a composition comprising a poly(aryl ether) containing recurring units of the formula

—O—E—O—E'— wherein E is the residuum of mixtures of 4,4'-biphenol and hydroquinone containing from about 10 to about 90 mole percent of 4,4'-biphenol; and wherein E' is the residuum of 4,4'-dichlorodiphenyl sulfone; and wherein the poly(aryl ether) has a reduced viscosity of at least 0.3 dl/g, as measured in N-methylpyrrolidone, at a concentration of 1.0 g/100 ml. at 25° C.

5. A circuit board substrate molded from a composition comprising a poly(aryl ether) containing recurring units of the formula

—O—E—O—E'— wherein E is the residuum of mixtures of 4,4'-biphenol and 4,4'-dihydroxydiphenyl sulfone containing from about 60 to about 90 mole percent of 4,4'-biphenol; and wherein E' is the residuum of 4,4'-dichlorodiphenyl sulfone; and wherein the poly(aryl ether) has a reduced viscosity of at least 0.3 dl/g, as measured in N-methylpyrrolidone, at a concentration of 1.0 g/100 ml. at 25° C.

6. A circuit board substrate molded from a composition comprising a poly(aryl ether) containing recurring units of the formula

—O—E—O—E'— wherein E is the residuum of mixtures of hydroquinone and bisphenol-A containing from about 60 to about 90 mole percent of hydroquinone; and wherein E' is the residuum of 4,4'-dichlorodiphenyl sulfone; and wherein the poly(aryl ether) has a reduced viscosity of at least 0.3 dl/g, as measured in N-methylpyrrolidone, at a concentration of 1.0 g/100 ml at 25° C.

7. A circuit board substrate as defined in claims 1 or 2 or 3 or 4 or 5 or 6 wherein the composition contains up to about 50 weight percent of a mineral filler.

8. A circuit board substrate as defined in claim 7 wherein the mineral filler is selected from wollastonite, calcium carbonate, glass beads, talc, mica, clay and quartz.

9. A circuit board substrate as defined in claims 1 or 2 or 3 or 4 or 5 or 6 wherein the composition contains up to about 50 weight percent of a reinforcing fiber.

10. A circuit board substrate as defined in claim 9 wherein the reinforcing fiber is selected from fiberglass and carbon fibers.

11. A circuit board substrate molded from a composition comprising a poly(aryl ether) containing recurring units of the formula

—O—E—O—E'— wherein E is the residuum of a mixture of dihydric alcohols selected from the group consisting of
- tetramethylbisphenol-A and up to 50 mole percent of 4,4'-biphenol,
- tetramethylbisphenol-A and up to 50 mole percent of bisphenol-A,
- tetramethylbisphenol-A and up to a total of 50 mole percent of 4,4'-biphenol and bisphenol-A,
- 4,4'-bisphenol-S and bisphenol-A containing from about 60 to about 70 mole percent of bisphenol-A,
- 4,4'-biphenol and bisphenol-A containing from about 50 to about 90 mole percent of 4,4'-biphenol,
- 4,4'-biphenol and hydroquinone containing from about 10 to about 90 mole percent of hydroquinone,
- 4,4'-biphenol and 4,4'-bisphenol-S containing from about 60 to about 90 mole percent of 4,4'-biphenol, and,
- hydroquinone and bisphenol-A containing from about 60 to about 90 mole percent of hydroquinone; and wherein E' is the residuum of 4,4'-dichlorodiphenyl sulfone; and wherein the poly(aryl ether) has a reduced viscosity of at least 0.3 dl/g, as measured in N-methylpyrrolidone at a concentration of 1.0 g/100 ml at 25° C.

* * * * *